(12) United States Patent
Bode et al.

(10) Patent No.: US 7,120,514 B1
(45) Date of Patent: Oct. 10, 2006

(54) METHOD AND APPARATUS FOR PERFORMING FIELD-TO-FIELD COMPENSATION

(75) Inventors: Christopher A. Bode, Austin, TX (US); Joyce S. Oey Hewett, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 786 days.

(21) Appl. No.: 09/815,446

(22) Filed: Mar. 22, 2001

(51) Int. Cl.
*G06F 19/00* (2006.01)
*G06F 7/48* (2006.01)

(52) U.S. Cl. .............................. 700/121; 703/6; 438/5; 438/7; 356/508; 356/509

(58) Field of Classification Search ...... 703/6; 430/22, 30; 382/147; 700/121; 438/5, 7; 356/508, 509
See application file for complete search history.

(56) References Cited

U.S. PATENT DOCUMENTS

| | | | | |
|---|---|---|---|---|
| 4,397,543 A | * | 8/1983 | Kolbe et al. ............... 355/40 |
| 5,243,195 A | * | 9/1993 | Nishi ........................ 250/548 |
| 5,438,413 A | * | 8/1995 | Mazor et al. .............. 356/508 |
| 5,444,538 A | * | 8/1995 | Pellegrini ................... 356/401 |
| 5,877,861 A | * | 3/1999 | Ausschnitt et al. ........ 356/401 |
| 5,989,761 A | * | 11/1999 | Kawakubo et al. .......... 430/22 |
| 6,163,366 A | * | 12/2000 | Okamoto et al. ............ 355/53 |
| 6,372,395 B1 | * | 4/2002 | Kawakubo et al. .......... 430/22 |
| 6,445,206 B1 | * | 9/2002 | Montull et al. ............. 324/765 |
| 6,456,736 B1 | * | 9/2002 | Su et al. ..................... 382/147 |
| 6,528,219 B1 | * | 3/2003 | Conrad et al. ................ 430/22 |
| 6,587,744 B1 | * | 7/2003 | Stoddard et al. ............ 700/121 |
| 6,594,002 B1 | * | 7/2003 | Drohan et al. ................ 356/73 |
| 6,699,627 B1 | * | 3/2004 | Smith et al. .................. 430/22 |

OTHER PUBLICATIONS

Pete Klimecky, Craig Garvin, Cecilia G. Galarza, Brook S. Stutzman, Pramod P. Khargonekar and Fred L. Terry, Jr., "Real-Time Reactive Ion Etch Metrology Techniques to Enable In Situ response Surface Process Characterization" Sep. 4, 2000, 7 pages.*
Terrence E. Zavecz, Rene Blanquies, "Predictive process control for sub-0.2 um lithography" SPIE, Mar. 2000, pp. 1-12.*

* cited by examiner

*Primary Examiner*—Paul Rodriguez
*Assistant Examiner*—Dwin M. Craig
(74) *Attorney, Agent, or Firm*—Williams, Morgan & Amerson, P.C.

(57) ABSTRACT

The present invention provides for a method and an apparatus for performing field-to-field compensation during semiconductor manufacturing. At least one semiconductor device is processed. Metrology data is collected from the processed semiconductor device. A field-to-field metrology analysis is performed based upon the metrology data. Residual-error analysis is performed based upon the field-to-field analysis.

34 Claims, 6 Drawing Sheets

METHOD AND APPARATUS FOR PERFORMING FIELD-TO-FIELD COMPENSATION

BACKGROUND OF THE INVENTION

1. Field of the Invention

This invention relates generally to semiconductor manufacturing, and, more particularly, to a method and apparatus for performing field-to-field compensation for errors in semiconductor manufacturing processes.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are effectively initiating and continuing a manufacturing process without significant human interaction, which can cause delays or errors in the manufacturing process. One of the process steps that is adversely affected by such factors is the photolithography overlay process. Overlay is one of several important steps in the photolithography area of semiconductor manufacturing. Overlay control involves measuring the misalignment between two successive patterned layers on the surface of a semiconductor device. Generally, alignment is important to ensure that the multiple layers of the semiconductor devices are connected and functional. As technology facilitates smaller critical dimensions for semiconductor devices, the need for reduced misalignment errors increases dramatically.

Generally, photolithography engineers use results from the analysis of the overlay errors to make updates to exposure tool settings manually. Some of the problems associated with the current methods include the fact that the exposure tool settings are only updated a few times a month. Furthermore, often the exposure tool updates are performed manually. Similarly, improvements in error prevention and correction in other types of semiconductor manufacturing processes are also needed to improve yields in semiconductor manufacturing processes.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to a machine interface. The machine interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner. Furthermore, wafer-to-wafer manufacturing variations can cause non-uniform quality of semiconductor devices.

Many times processed semiconductor wafers can have portions that contain errors, such as overlay errors. Often, a small error on a portion of a processed semiconductor can go unnoticed. This small error may cause a persistent bias in that portion, and subsequent processes may add to the error, causing a substantial error. Many times, these small errors can be caused by abnormalities in a stepper lens, errors in the manner the wafer is positioned in a stepper, and the like. Small residual errors, such as errors caused by persistent biases, can cause yield degradation in the manufacturing of semiconductor wafers.

The present invention is directed to overcoming, or at least reducing the effects of, one or more of the problems set forth above.

SUMMARY OF THE INVENTION

In one aspect of the present invention, a method is provided for performing field-to-field compensation. At least one semiconductor device is processed. Metrology data is collected from the processed semiconductor device. A field-to-field metrology analysis is performed based upon the metrology data. Residual-error analysis is performed based upon the field-to-field analysis.

In another aspect of the present invention, an apparatus is provided for performing field-to-field compensation. The apparatus of the present invention comprises: a computer system; a manufacturing model coupled with the computer system, the manufacturing model being capable of generating and modifying at least one control input parameter signal; a machine interface coupled with the manufacturing model and the computer system, the machine interface being capable of receiving process data from the manufacturing model and the computer system; a processing tool coupled with the machine interface, the processing tool being capable of receiving at least one control input parameter signal from the machine interface and performing a manufacturing process; a metrology tool coupled with the processing tool, the metrology tool being capable of acquiring field-level metrology data; and a metrology data processing unit coupled with the metrology tool and the processing tool, the metrology data processing unit being capable of organizing and analyzing the acquired field-level data and calculating at least one manufacturing error for generating modification data.

BRIEF DESCRIPTION OF THE DRAWINGS

The invention may be understood by reference to the following description taken in conjunction with the accompanying drawings, in which like reference numerals identify like elements, and in which.

Figure 1:
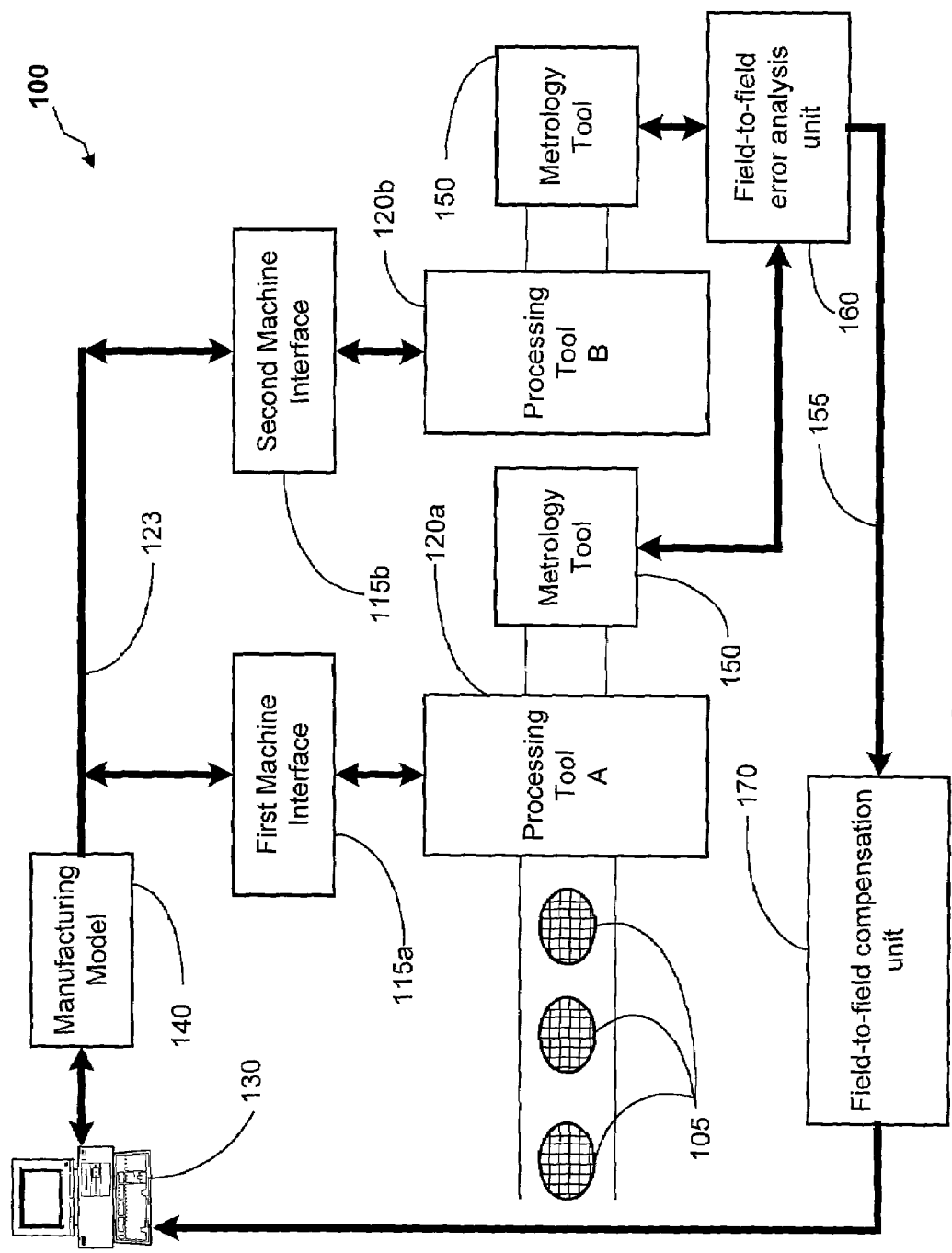
FIG. 1 illustrates a system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Wafer-to-wafer, wafer-lot to wafer-lot, and even field-to-field (portions of a wafer) variations can result in non-uniform semiconductor devices. Furthermore, fast, efficient, and accurate identification of process errors can improve overall results in semiconductor manufacturing environments. Embodiments of the present invention provide for performing field-to-field analysis of semiconductor wafers to improve overall manufacturing performance.

Semiconductor devices are processed in a manufacturing environment using a number of input control parameters. Turning now to FIG. 1, a system 100 in accordance with one embodiment of the present invention is illustrated. In one embodiment, semiconductor products 105, such as semiconductor wafers, are processed on processing tools 120a, 120b using a plurality of control input signals, or manufacturing parameters, on a line 123. In one embodiment, control input signals, or process signals, on the line 123 are sent to the processing tools 120a, 120b from a computer system 130 via machine interfaces 115a, 115b. In one embodiment, the first and second machine interfaces 115a, 115b are located outside the processing tools 120a, 120b. In an alternative embodiment, the first and second machine interfaces 115a, 115b are located within the processing tools 120a, 120b.

In one embodiment, the computer system 130 sends control input signals, or manufacturing parameters, on the line 123 to the first and second machine interfaces 115a, 115b. The computer system 130 employs a manufacturing model 140 to generate the control input signals on the line 123. In one embodiment, the manufacturing model 140 contains a manufacturing recipe that determines a plurality of control input parameters that are sent on the line 123.

In one embodiment, the manufacturing model 140 defines process scripts and input controls that are used to implement a particular manufacturing process. Control input signals on a line 123 that are intended for the processing tool A 120a are received and processed by the first machine interface 115a. The control input signals on the line 123 that are intended for processing tool B 120b are received and processed by the second machine interface 115b. Examples of the processing tools 120a, 120b used in semiconductor manufacturing processes are steppers, scanners, step-and-scan tools, and etch process tools. In one embodiment, the processing tool A 120a and the processing tool B 120b are photolithography process tools, such as steppers.

One or more of the semiconductor wafers that are processed by the processing tools 120a, 120b can also be sent to a metrology tool 150 for acquisition of metrology data. The metrology tool 150 can be a scatterometry data acquisition tool, an overlay-error measurement tool, a critical dimension measurement tool, and the like. In one embodiment, one or more processed semiconductor wafers are examined by a metrology tool 150. The metrology tool 150 is capable of performing metrology data acquisition from a particular field on the semiconductor wafer. In one embodiment, a field is an area on a semiconductor wafer where a photolithography process applies light during a given period of time. In one embodiment, the metrology tool 150 can be integrated as an inline metrology tool. Data from the metrology tool 150 is examined by a field to field error analysis unit 160. The field to field error analysis unit 160 organizes, analyses, and correlates the field metrology data acquired by the metrology tool 150, to particular fields that were examined. The field to field error analysis unit 160 can be a software unit, a hardware unit, or a firmware unit. The field to field compensation unit 170 is capable of calculating error compensation factors, such as modified control parameters, to compensate for field errors on a field to field basis, or on a wafer to wafer basis. field to field compensation unit 170 can be a software unit, a hardware unit, or a firmware unit.

Among the bases for modifying the control input signal on the line 123 are metrology measurements, inline and external measurement, performed on processed semiconductor wafers, such as scatterometry measurements. The metrology measurements are used to perform a feedback modification of the control input signals. In one embodiment, the feedback modification of the control input signals on the line 123 are performed on photolithography processes, such as line width adjustments using photo exposure dosages and line profile adjustments using exposure focus modifications. Feedback modification of the control input signal on the line 123 can also be performed on etch processes, such as etch line shape adjustments using etch recipe modifications.

In the context of a manufacturing process such as a stepper process, the control inputs on the line 123 that are used to operate the processing tool 120 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool.

When a process step in the processing tool 120 is concluded, the semiconductor wafer that is being processed in the processing tool 120, in one embodiment, is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, the modifications to the control input signals on the line 123 are based on the effects of external variables on the semiconductor devices being processed. The error detection and error compensation described above, in one embodiment, is performed on a field-to-field basis.

Figure 2:
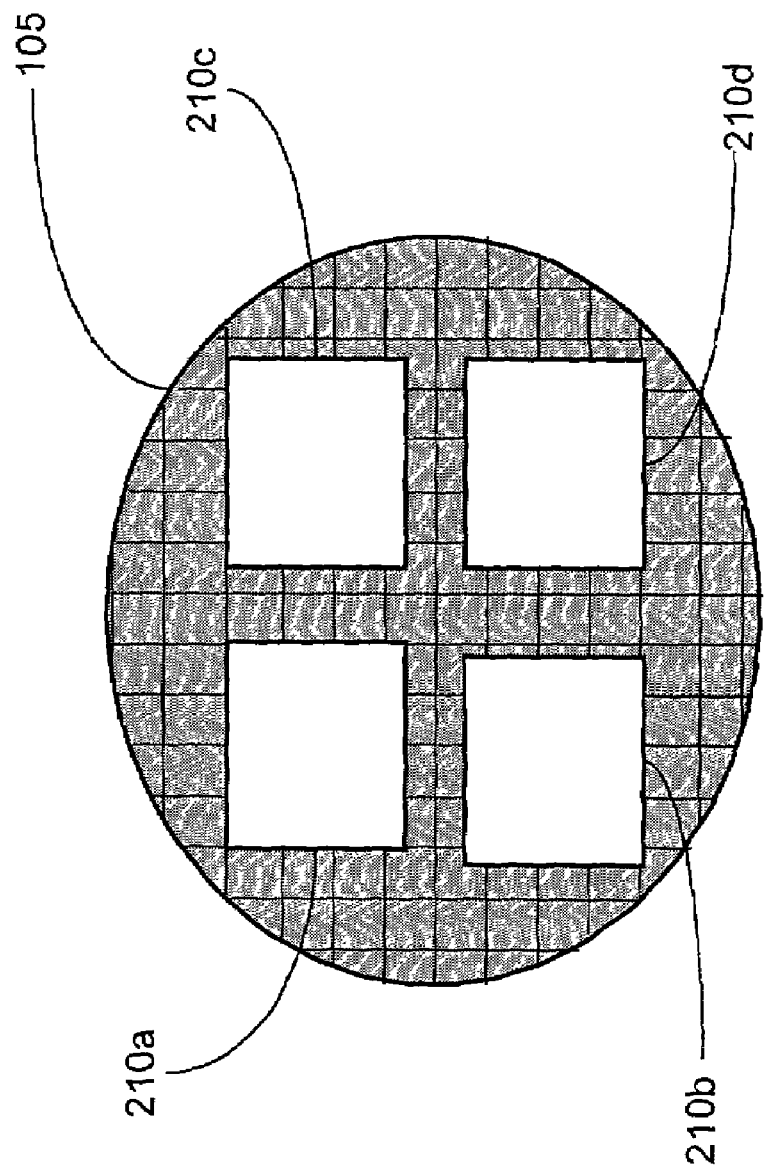
FIG. 2 illustrates a semiconductor wafer field in accordance with one embodiment of the present invention.

FIG. 2 illustrates a semiconductor device 105, such as a semiconductor wafer, being processed in a photolithography manufacturing process. During a photolithography process the semiconductor device 105 is exposed to light, which is shined through exposure masks (not shown). The light shining on the semiconductor device 105 generates patterns on the semiconductor device 105. The processing tool 120, which in one embodiment is an exposure tool or a stepper, generates patterns in photoresist material that is placed on the semiconductor device 105. Generally, the exposure tool shines light through a reticle that causes light to strike only certain portions of the semiconductor wafer at a given period of time. The portion of the semiconductor wafer that is exposed to light during any given time period is called an exposure field 210. FIG. 2 illustrates a plurality of exposure fields 210 (1st through nth exposure fields 210a–210d). Embodiments taught by the present invention are capable of performing field-to-field adjustments and corrections of semiconductor manufacturing processes on each exposure field 210.

In one embodiment, as shown in FIG. 1, the field-to-field metrology data is collected by a metrology tool 150 that is external to the processing tools 120. Metrology data from the metrology tool 150 is analyzed by the field-to-field error analysis unit 160. The field-to-field error analysis unit 160 examines errors, such as overlay errors, on the exposure fields 210 and checks for repetitive errors that can accumulate over a number of process steps. In one embodiment, the field-to-field error analysis unit 160 is integrated within the computer system 130. A field-to-field compensation feedback unit 170 receives data from the field-to-field error analysis unit 160 and performs feedback compensation to adjust semiconductor manufacturing process steps to reduce accumulative or repetitive errors. In one embodiment, the field-to-field compensation feedback unit 170 is integrated with in the computer system 130.

Figure 3:
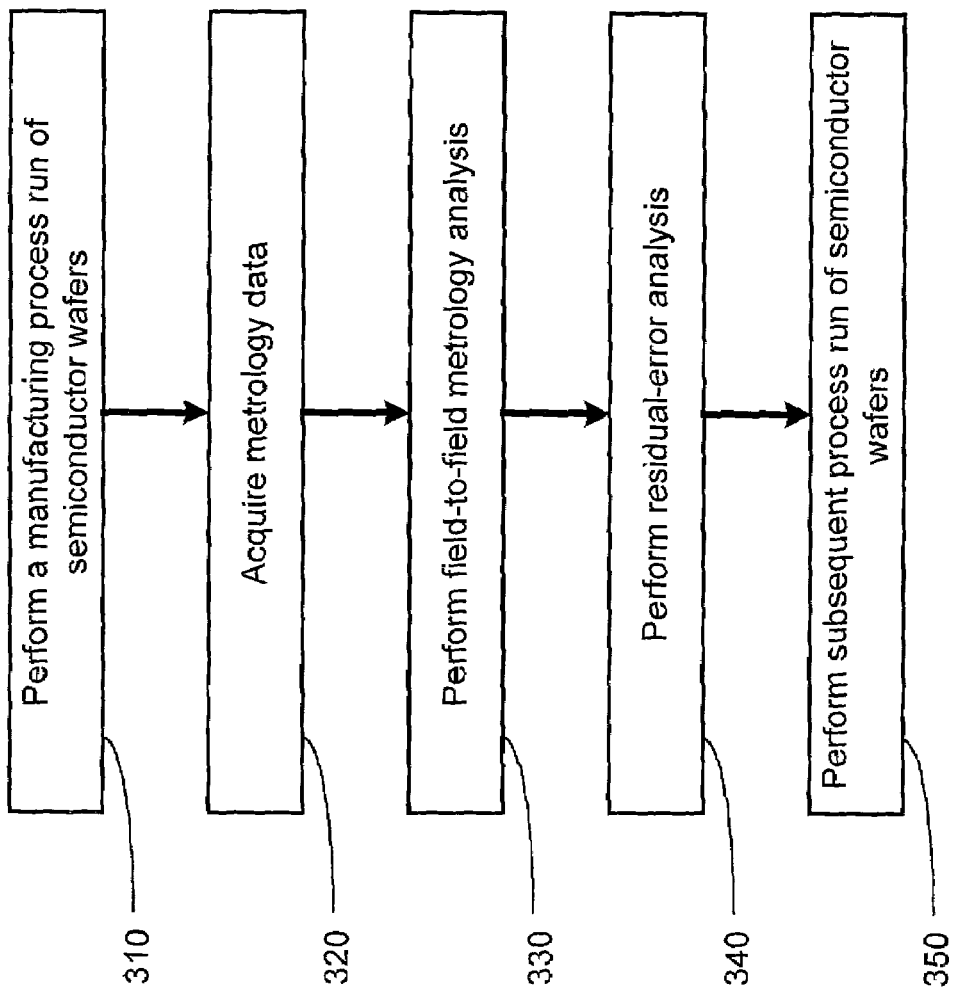
FIG. 3 illustrates a flowchart depiction of a method in accordance with one embodiment of the present invention.

FIG. 3 illustrates a flow chart depiction of one embodiment of the method of performing field-to-field manufacturing adjustments, prescribed by the present invention. The system 100, in one embodiment, performs a manufacturing processing run of an initial set of semiconductor wafers (block 310). The manufacturing process run includes performing a photolithography process, an etching process, an RTA process, and the like. When the system 100 substantially completes the manufacturing process run of semiconductor wafers, the system 100 acquires metrology data or manufacturing data by examining the processed semiconductor wafers (block 320). In one embodiment, when the processing tool 120 performs the process run of semiconductor wafers, metrology data is acquired by the metrology tool 150. In one embodiment, the metrology tool 150 performs field-to-field metrology data acquisition. The metrology tool 150 used to acquire metrology data is one of many metrology tools known to those skilled in the art.

Figure 4:
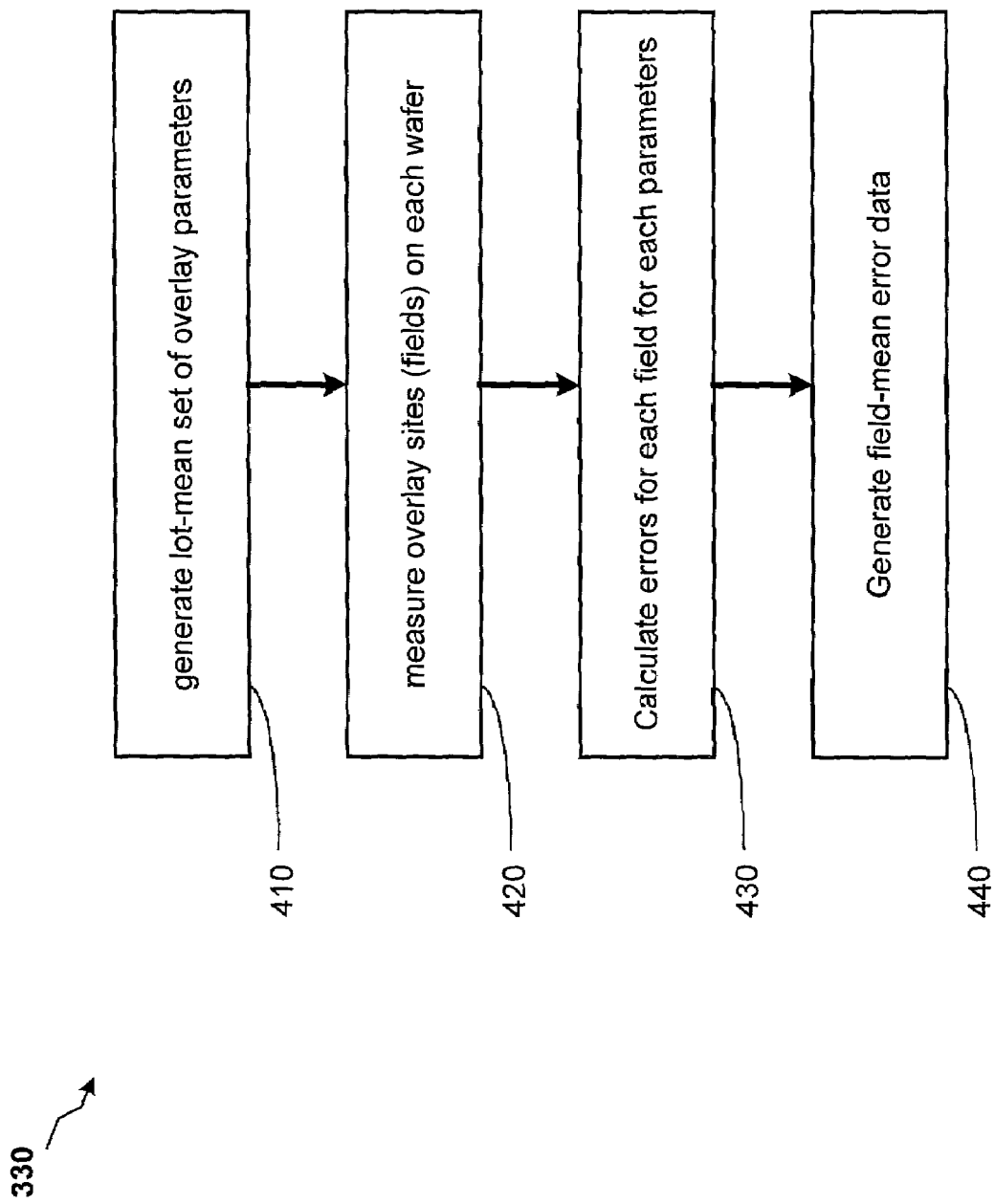
FIG. 4 illustrates a flowchart depiction of a method of acquiring metrology data as described in FIG. 4, in accordance with one embodiment of the present invention.

Once the system 100 acquires metrology data, the system 100 performs a field-to-field metrology analysis process (block 330). One embodiment of the steps for performing the field-to-field metrology analysis is illustrated in a flowchart form in FIG. 4. Turning now to FIG. 4, the system 100 generates a lot-mean sized set of overlay parameters (block 410). In other words, metrology data in terms of a mean value for an entire manufacturing lot of semiconductor wafers, is acquired.

Although field-to-field metrology analysis is described in relation to photolithography processes, embodiments illustrated in the present disclosure can be modified or adapted for application in other types of semiconductor manufacturing processes. Examples of the lot-mean set of overlay parameters include defining an x-direction error tolerance, an y-direction error tolerance, a misalignment error tolerance, and the like, in terms of a mean value for the entire lot of semiconductor wafers. Subsequently, parameters relating to the plurality of overlay sites, or fields, on each semiconductor wafer being processed are measured and recorded (block 420). In one embodiment, metrology data relating to all exposure fields 210 are already captured by the metrology tool 150 and are sent to the field-to-field error analysis unit 160. In one embodiment, the field-to-field error analysis unit 160 is capable of locating corresponding field parameter data acquired by the metrology tool 150 and correlating them to the lot-mean overlay parameters generated by the system 100.

Once the overlay fields 210 on each semiconductor wafer is measured and correlated with predetermined corresponding overlay parameters, the system 100 calculates the misalignment or misregistration errors for each exposure field 210 relating to each parameter (block 430). For example, for each exposure field 210 on the semiconductor wafer being processed, the system 100 compares an actual x-direction misalignment with a predetermined x-direction parameter in order to calculate the overlay error for that particular field. Similarly, other parameters are also compared, and error calculations are made accordingly. The calculated field error is then used by the system 100 to calculate a field-mean error data (block 440).

Utilizing the above-mentioned technique, the average overlay error for a particular exposure field 210 is recorded and tracked. Many times, errors in a particular exposure field 210 may not be large enough or within an error tolerance threshold, wherein the error in that exposure field 210 may be ignored. However, small amounts of errors in a particular field, known as residual errors, may continue to add up or build up during manufacturing processes. The build-up of these errors can cause significant wafer casualties at the end of a multiprocessing cycle. Therefore, it is desirable to track residual errors corresponding to a particular field reduce accumulation of residual errors. The completion of the steps described in FIG. 4 substantially completes the process of field-to-field metrology analysis described in block 330 of FIG. 3.

Turning back to FIG. 3, once the field-to-field metrology analysis process is performed, a residual-error analysis is performed by the system 100 (block 340). A first embodiment of the steps of the method of performing the residual-error analysis described in block 340, is illustrated in a flowchart form in FIG. 5.

Figure 5:
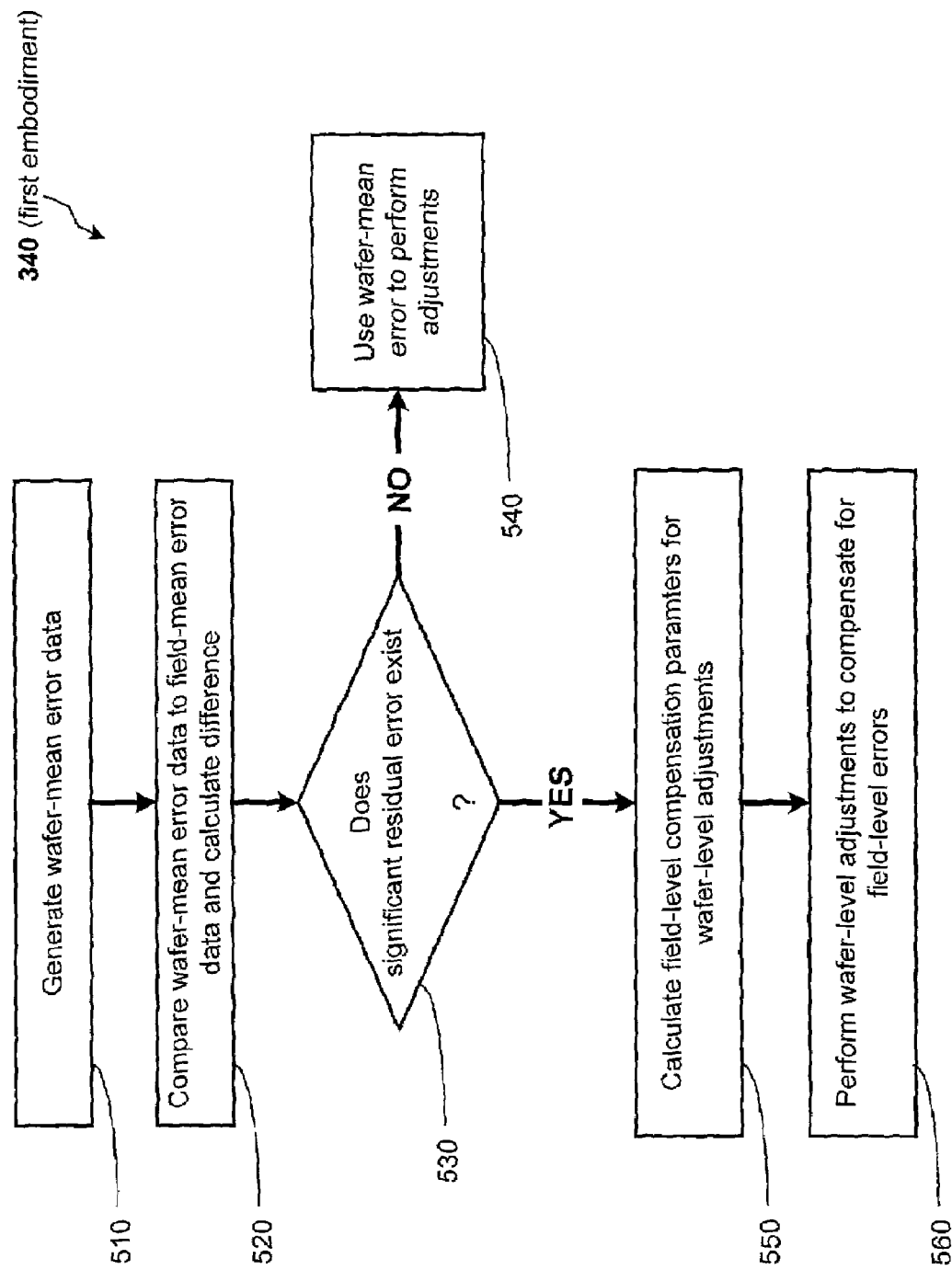
FIG. 5 illustrates a flowchart depiction of a method of performing a residual-error analysis in accordance with a first embodiment of the present invention.

Turning now to FIG. 5, the field-mean error data acquired during the field-to-field metrology analysis process, is used by the system 100 to generate a wafer-mean error data set (block 510). A wafer-mean error data set relates to the average overlay error for a particular wafer as a whole from one process to the other. In contrast to the wafer-mean error data, the field-mean error data corresponds to the average overlay error relating to a particular field from one process to another. The system 100 compares the wafer-mean error data to the field-mean error data and calculates a difference between the two (block 520). For example, the x-direction misalignment errors relating to a field-to-field basis from one process to another, is compared to the average x-direction misalignment error on a wafer to wafer basis from one process to another.

The comparison and calculation of the difference in the wafer-mean error to the field-mean error is used by the system 100 to determine whether significant residual error exists within any particular exposure field 210 on the semiconductor wafer (block 530). The amount of residual error, as compared to a pre-determined threshold tolerance, is used to determine whether a particular residual error in a particular exposure field 210 may accumulate within a plurality of processes such that a significant error will result in the processed semiconductor wafer. When a determination is made that no significant residual error exists in any particular exposure field 210, the wafer-mean overlay error is used to perform further adjustments or feedback corrections for subsequent wafer processing (block 540).

When a determination is made that significant residual error exists, such that significant error may result in the processed semiconductor wafer, the system 100 calculates field compensation parameters to be used for wafer-level adjustments (block 550). In other words, the system uses field-level, or field-mean, error data to adjust or compensate for the exposure field 210 error. The field compensation parameters are then used by the system 100 to perform wafer-level adjustments in order to compensate for the field level errors (Block 560). In other words, the errors, such as an x-direction misalignment error inside a particular exposure field 210, is used as a extrapolation means to generally compensate for errors during a subsequent photolithography process that is performed on the semiconductor wafer.

Figure 6:
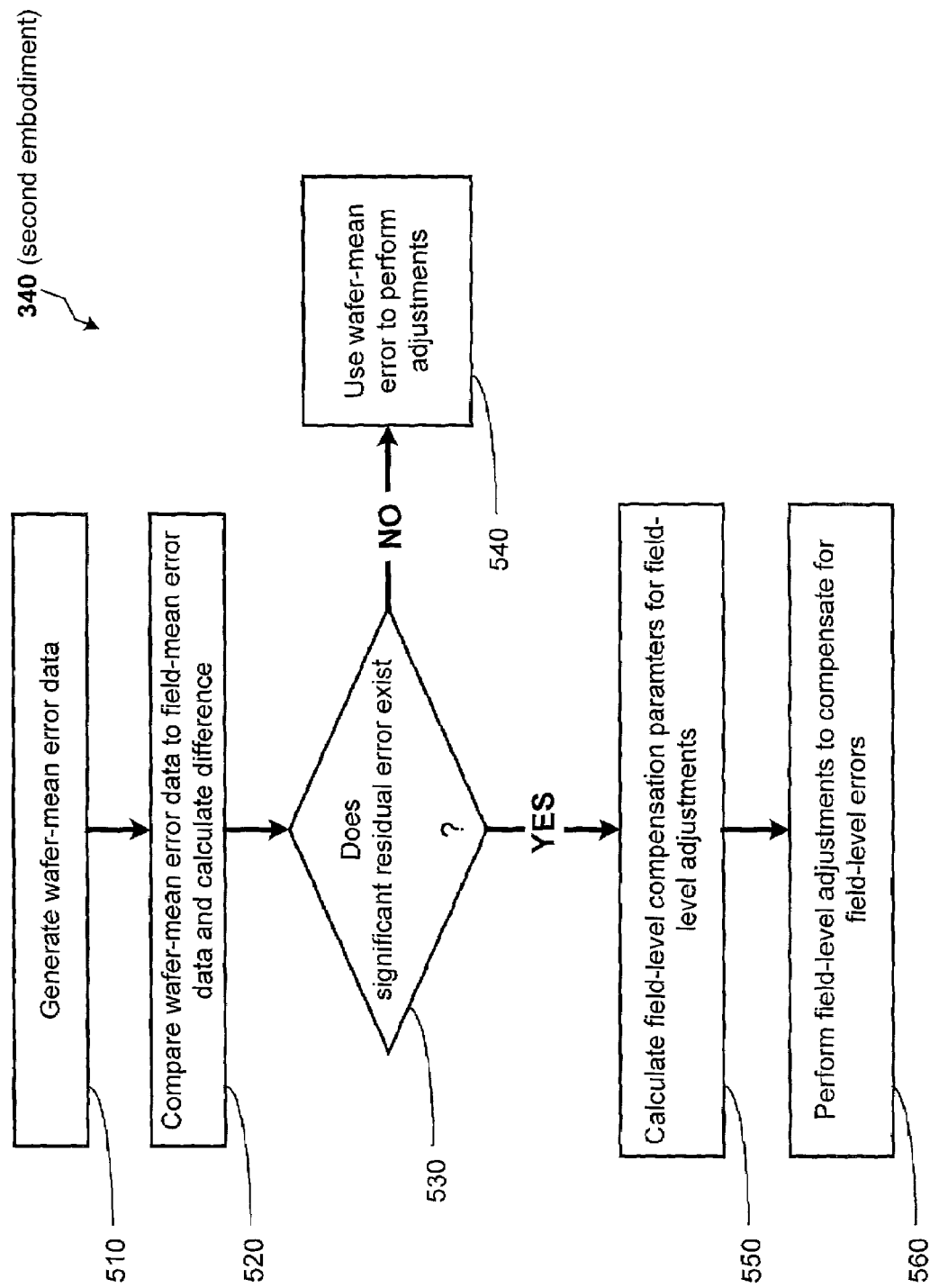
FIG. 6 illustrates a flowchart depiction of a method of performing a residual-error analysis in accordance with a second embodiment of the present invention.

The completion of the steps described in block 560 (performing wafer level adjustments to compensate for field level errors), substantially completes the step of performing residual-error analysis described in block 340 of FIG. 3. FIG. 6 illustrates a second embodiment of performing a residual-error analysis.

Turning now to FIG. 6, blocks 610 through 640 are substantially similar to the methods and steps described in blocks 510 through 540 of FIG. 5. In other words, as described earlier, the system generates a wafer-mean error, compares the wafer-mean data error to the field mean error data, and calculates a difference (blocks 610–620). Subsequently, a determination is made whether a significant amount of residual error exists by examining the calculated difference between the wafer-mean error and the field-mean error (block 530). When a determination is made no significant residual error exists in any particular exposure field 210, the wafer-mean overlay error is used to perform adjustments for subsequent processing of the semiconductor wafer (block 640).

When a determination is made that significant residual errors exist within any particular field on the semiconductor wafer, at least one field compensation parameter is calculated for field-level adjustments. In other words, a field-level parameter, such as an x-direction error relating to a line within an exposure field 210, is used to calculate a parameter to compensate for that particular error within that particular exposure field 210 (block 660). The field compensation parameter is then used to perform a field level adjustment in order to compensate for the field level error or errors. In other words, field level adjustments are used by the system 100 to compensate for errors within a particular field. Therefore, a single exposure field 210 within a wafer can be targeted for feedback adjustments during subsequent processing of the semiconductor wafer.

In an alternative embodiment, a subsequent process limited to the particular field may be performed in order to compensate for a field level error. The completion of the steps described in FIG. 6 substantially completes the step of performing residual error analysis described in block 340 of FIG. 3. Turning back to FIG. 3, once the residual error analysis is substantially completed, subsequent manufacturing process run of the semiconductor wafer under examination is performed (block 350). The subsequent processing run of the semiconductor wafer is performed using wafer level adjustments or field level adjustments in order to compensate for errors calculated from examining field level errors. The steps described above can be used to compensate for errors in a variety of semiconductor manufacturing processes. Furthermore, the steps described by the embodiments of the present invention can be used for other types of manufacturing environments.

The principles taught by the present invention can be implemented in an Advanced Process Control (APC) Framework. The APC is a one platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   processing at least one semiconductor device;
   acquiring metrology data from said processed semiconductor device;
   performing a field-to-field metrology analysis based upon said metrology data to determine a field-mean error;
   determining a wafer-mean error;
   comparing said field-mean error to said wafer-mean error;
   performing residual-error analysis based upon said field-to-field analysis and said wafer-mean error, said residual-error analysis comprising determining whether significant residual error exists as a result of comparing said residual error with a predetermined tolerance, said residual-error analysis being based upon said comparison of said wafer-mean error and said field-mean error data; and
   performing at least one of a field-level adjustment and a wafer-level adjustment based upon said residual-error analysis.

2. The method described in claim 1, further comprising processing said semiconductor device in a subsequent manufacturing process based upon said residual-error analysis.

3. The method described in claim 1, wherein processing at least one semiconductor device further comprises processing semiconductor wafers.

4. The method described in claim 1, wherein acquiring metrology data from said processed semiconductor device further comprises acquiring field-to-field metrology data analysis.

5. The method described in claim 1, wherein performing the field-to-field metrology analysis comprises:
   acquiring overlay error data from at least one exposure field on each processed wafer;
   calculating overlay errors for said exposure field based upon said overlay error; and
   generating a set of field-mean error data.

6. The method described in claim 5, wherein calculating overlay errors for said exposure field comprises calculating at least one misregistration error.

7. The method described in claim 5, wherein calculating overlay errors for said exposure field comprises calculating at least one misalignment error.

8. The method described in claim 5, wherein performing residual-error analysis comprises:
   generating wafer-mean error data;
   comparing said wafer-mean error data to said field-mean error to calculate a difference between said wafer-mean error and said field-mean error data;
   determining whether a significant residual error exists based upon said comparison of said wafer-mean error and said field-mean error data; and
   using said wafer-mean error to perform manufacturing adjustments in response to a determination that significant residual error does not exist.

9. The method described in claim 8, further comprising:
   calculating at least one field compensation parameter for at least one wafer-level adjustment in response to a determination that significant residual error exists; and
   performing at least one wafer-level adjustment to compensate for at least one field-level error.

10. The method described in claim 8, further comprising:
    calculating at least one field compensation parameter for at least one field-level adjustment in response to a determination that significant residual error exists; and
    performing at least one field-level adjustment to compensate for at least one field-level error.

11. A system, comprising:
    a computer system;
    a manufacturing model coupled with said computer system, said manufacturing model being capable of generating and modifying at least one control input parameter signal;
    a machine interface coupled with said manufacturing model and said computer system, said machine interface being capable of receiving process data from said manufacturing model and said computer system;
    a processing tool coupled with said machine interface, said processing tool being capable of receiving at least one control input parameter signal from said machine interface and performing a manufacturing process;
    a metrology tool coupled with said processing tool, said metrology tool being capable of acquiring field-level metrology data; and
    a metrology data processing unit coupled with said metrology tool and said processing tool, said metrology data processing unit being capable of organizing and analyzing said acquired field-level data and calculating at least one manufacturing error based upon a comparison of a field-mean error and a wafer-mean error for generating modification data, wherein said manufacturing error comprises a residual error determined as a result of comparing said field-mean error and said wafer-mean error.

12. The system of claim 11, wherein said computer system is capable of generating field-level compensation modification data based on said manufacturing error for modifying at least one manufacturing parameter.

13. The system of claim 12, wherein said manufacturing model is capable of modifying said manufacturing parameter in response to said field-level compensation modification data.

14. The system of claim 13, wherein said processing tool is further capable of performing field-level manufacturing process.

15. An apparatus, comprising:
    means for processing at least one semiconductor device;
    means for acquiring metrology data from said processed semiconductor device;
    means for performing a field-to-field metrology analysis based upon said metrology data to determine a field-mean error;
    means for determining a wafer-mean error;
    means for comparing said field-mean error to said wafer-mean error;
    means for performing residual-error analysis based upon said field-to-field analysis and said wafer-mean error, said means for performing said residual-error analysis comprising means for determining whether a significant residual error exists as a result of comparing said residual error with a predetermined tolerance, said residual-error analysis being based upon said comparison of said wafer-mean error and said field-mean error data; and means for performing at least one of a field-level adjustment and a wafer-level adjustment based upon said residual-error analysis.

16. A computer readable program storage device encoded with processing at least one semiconductor device;

acquiring metrology data from said processed semiconductor device;

performing a field-to-field metrology analysis based upon said metrology data to determine a field-mean error;

determining a wafer-mean error;

comparing said field-mean error to said wafer-mean error;

performing residual-error analysis based upon said field-to-field analysis and said wafer-mean error, said residual-error analysis comprising determining whether a significant residual error exists as a result of comparing said residual error with a predetermined tolerance, said residual-error analysis being based upon said comparison of said wafer-mean error and said field-mean error data; and performing at least one of a field-level adjustment and a wafer-level adjustment based upon said residual-error analysis.

17. The computer readable program storage device encoded with instructions that, when executed by a computer, performs the method described in claim 16, further comprising processing said semiconductor wafer in a subsequent manufacturing process based upon said residual-error analysis.

18. The computer readable program storage device encoded with instructions that, when executed by a computer, performs the method described in claim 16, wherein processing at least one semiconductor device further comprises processing semiconductor wafers.

19. The computer readable program storage device encoded with instructions that, when executed by a computer, performs the method described in claim 16, wherein acquiring metrology data from said processed semiconductor device further comprises acquiring field-to-field metrology data.

20. The computer readable program storage device encoded with instructions that, when executed by a computer, performs the method described in claim 16, wherein performing the field-to-field metrology analysis comprises:

acquiring overlay error data from at least one exposure field on each processed wafer;

calculating overlay errors for said exposure field based upon said overlay error; and generating a set of field-mean error data.

21. The computer readable program storage device encoded with instructions that, when executed by a computer, performs the method described in claim 20, wherein calculating overlay errors for said exposure field comprises calculating at least one misregistration error.

22. The computer readable program storage device encoded with instructions that, when executed by a computer, performs the method described in claim 20, wherein calculating overlay errors for said exposure field comprises calculating at least one misalignment error.

23. The computer readable program storage device encoded with instructions that, when executed by a computer, performs the method described in claim 20, wherein performing residual-error analysis comprises:

generating wafer-mean error data;

comparing said wafer-mean error data to said field-mean error to calculate a difference between said wafer-mean error and said field-mean error data;

determining whether a significant residual error exists based upon said comparison of said wafer-mean error and said field-mean error data; and using said wafer-mean error to perform manufacturing adjustments in response to a determination that significant residual error does not exist.

24. The computer readable program storage device encoded with instructions that, when executed by a computer, performs the method described in claim 23, further comprising:

calculating at least one field compensation parameter for at least one wafer-level adjustment in response to a determination that significant residual error exists; and performing at least one wafer-level adjustment to compensate for at least one field-level error.

25. The computer readable program storage device encoded with instructions that, when executed by a computer, performs the method described in claim 23, further comprising:

calculating at least one field compensation parameter for at least one field-level adjustment in response to a determination that significant residual error exists; and performing at least one field-level adjustment to compensate for at least one field-level error.

26. A system, comprising:

a processing tool to process at least one semiconductor device;

a metrology tool to acquire metrology data from said processed semiconductor device;

a controller to determine a field-mean error and a wafer-mean error based upon said metrology data and comparing said field-mean error and said wafer-mean error to determine a residual error, the controller also to determine whether a significant residual error exists as a result of comparing said residual error with a predetermined tolerance, said residual-error analysis being based upon said comparison of said wafer-mean error and said field-mean error data, the controller also being adapted to perform at least one of a field-level adjustment and a wafer-level adjustment based upon said residual error.

27. The system of claim 26, wherein said semiconductor device is a semiconductor wafer.

28. The system of claim 26, wherein said controller is adapted to control a processing operation upon a subsequent semiconductor device.

29. An apparatus, comprising:

a controller to determine a field-mean error and a wafer-mean error based upon metrology data relating to a processed semiconductor device and comparing said field-mean error and said wafer-mean error to determine a residual error, said controller also to determine whether a significant residual error exists as a result of comparing said residual error with a predetermined tolerance, said residual-error analysis being based upon said comparison of said wafer-mean error and said field-mean error data, the controller also being adapted to perform at least one of a field-level adjustment and a wafer-level adjustment based upon said residual error.

30. The apparatus of claim 29, wherein said semiconductor device is a semiconductor wafer.

31. The apparatus of claim 29, wherein said controller is operatively coupled with a processing tool to control an operation of said processing tool.

32. The apparatus of claim 29, wherein said controller is capable of controlling a processing of a subsequent semiconductor device.

33. The method of claim 1, further comprising processing at least one additional semiconductor device.

34. The method of claim 1, further comprising performing a field level adjustment and a field-to-field adjustment.

* * * * *